United States Patent (12)
Yamazaki

(10) Patent No.: US 11,818,845 B2
(45) Date of Patent: Nov. 14, 2023

(54) COMPONENT MOUNTER

(71) Applicant: FUJI CORPORATION, Chiryu (JP)

(72) Inventor: Tomohiro Yamazaki, Nishio (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/619,284

(22) PCT Filed: Jun. 17, 2019

(86) PCT No.: PCT/JP2019/023837
§ 371 (c)(1),
(2) Date: Dec. 15, 2021

(87) PCT Pub. No.: WO2020/255186
PCT Pub. Date: Dec. 24, 2020

(65) Prior Publication Data
US 2022/0256748 A1 Aug. 11, 2022

(51) Int. Cl.
*B23P 19/00* (2006.01)
*H05K 13/04* (2006.01)
*H05K 13/08* (2006.01)
*H05K 13/02* (2006.01)

(52) U.S. Cl.
CPC ......... *H05K 13/0408* (2013.01); *H05K 13/02* (2013.01); *H05K 13/083* (2018.08); *H05K 13/0813* (2018.08)

(58) Field of Classification Search
CPC .............. H05K 13/02; H05K 13/0408; H05K 13/0813; H05K 13/083
See application file for complete search history.

(56) References Cited

U.S. PATENT DOCUMENTS 9,659,357 B2* 5/2017 Esaki .................. G06T 7/0004
10,091,374 B2* 10/2018 Miyazaki ........... G03G 15/2039
2015/0307288 A1 10/2015 Sumi

FOREIGN PATENT DOCUMENTS

JP 2002-185189 A 6/2002
JP 2005-166850 A 6/2005
JP 2006-93503 A 4/2006

(Continued)

OTHER PUBLICATIONS

International Search Report dated Sep. 3, 2019 in PCT/JP2019/023837 filed on Jun. 17, 2019, (4 pages).

*Primary Examiner* — Paul D Kim
(74) *Attorney, Agent, or Firm* — Oblon, McClelland, Maier & Neustadt, L.L.P.

(57) ABSTRACT

A component mounter includes a pickup member configured to pick up a component, and a control device. When a predetermined error occurs after a pickup operation that picks up the component is performed by the pickup member, the control device stops production in a state where the component, which is a target of an error, is held by the pickup member, in a case where a number of boards produced from a start of production is within a predetermined number of the boards, performs a retry operation that discards the component picked up by the pickup member and picks up a new component, in a case where the number of the boards produced from the start of production exceeds the predetermined number of the boards, and stops production when the error is not resolved even if the retry operation is performed.

5 Claims, 4 Drawing Sheets

(56) References Cited

FOREIGN PATENT DOCUMENTS

| JP | 2008-98355 A | 4/2008 |
| JP | 2015-135886 A | 7/2015 |
| JP | 2015-211054 A | 11/2015 |
| WO | WO 2016/194236 A1 | 12/2016 |

* cited by examiner

COMPONENT MOUNTER

TECHNICAL FIELD

The present specification discloses a component mounter.

BACKGROUND ART

Conventionally, as a component mounter of this type, a device in which a retry operation, which is a component pickup operation again, is repeated within a range of a set value of the number of retries until the component pickup succeeds when an error occurs in the component pickup has been proposed (refer to Patent Literature 1, for example). Multiple component mounters are arranged side by side to form a component mounting line. The component mounting line is managed by a production management system. The production management system is provided with retry number changing means for collectively changing the set value of the number of retries for all component mounters of one component mounting line assigned by an operator without stopping production during the production.

In addition, there has also been proposed a device that executes pickup mistake handling processing in a case where a pickup mistake in which a suction nozzle does not normally pick up and hold a component is continuously detected a predetermined number of times or more (refer to Patent Literature 2, for example). The pickup mistake handling processing is executed by following steps. First, a carrier tape is pitch-fed to image a pocket, recognition processing is executed, and a pocket position is detected. Subsequently, it is determined whether the pocket position falls within an allowable range. In a case where the pocket position does not fall within the allowable range, the capturing of the pocket and the detection of the pocket position are repeatedly executed until the pocket position falls within the allowable range, and in a case where the pocket position falls, the pickup position is corrected based on the pocket position.

PATENT LITERATURE

Patent Literature 1: WO2016/194236A1
Patent Literature 2: JP-A-2015-211054

BRIEF SUMMARY

Technical Problem

The retry operation normally involves discarding a component in which a pickup error occurs. When switching production models or the like, in some cases, it is necessary to first confirm whether the production is normally performed, and when an error occurs, since the component is discarded by the retry operation, the component is wastefully consumed.

A main object of the present disclosure is to provide a component mounter capable of confirming whether production is normally performed when the production is started while suppressing wasteful consumption of the component.

Solution to Problem

The present disclosure adopts the following means to achieve the main object described above.

A first component mounter of the present disclosure is a component mounter that produces a board on which a component is mounted by picking up the component and mounting the component on the board, and it is a gist to include a pickup member configured to pick up the component; and a control device configured to, when a predetermined error occurs after a pickup operation that picks up the component is performed by the pickup member, execute first error handling processing that stops production in a state where the component, which is a target of an error, is held by the pickup member, and in a case where a number of the boards produced from a start of production is within a predetermined number of the boards, perform a retry operation that discards the component picked up by the pickup member and picks up a new component, in a case where the number of the boards produced from the start of production exceeds the predetermined number of the boards, and execute second error handling processing that stops production when the error is not resolved even if the retry operation is performed.

When the predetermined error occurs after the pickup operation that picks up the component is performed by the pickup member, the first component mounter of the present disclosure executes the first error handling processing that stops the production in a state where the component, which is a target of an error, is held by the pickup member, in a case where the number of the boards produced from the start of production is within a predetermined number of the boards. In addition, the component mounter performs the retry operation that discards the component picked up by the pickup member and picks up the new component, in a case where the number of the boards produced from the start of production exceeds a predetermined number of the boards, and executes the second error handling processing that stops the production when the error is not resolved even if the retry operation is performed. In the component mounter, production may not be stable immediately after a model change or the like of a production board is performed. Therefore, in a case where the number of the boards produced from the start of production is within a predetermined number of the boards, by stopping the production in a state where the component, which is a target of the error, is held by the pickup member, it is possible to confirm a cause of the error and to prevent the component from being wastefully discarded. On the other hand, in a situation where the number of the boards produced from the start of production exceeds a predetermined number of the boards and the production is stable, by performing the retry operation involving the disposal of components, it is possible to suppress degradation in the production efficiency due to the stop of the production. Here, the predetermined number of the boards may be one.

A second component mounter of the present disclosure is a component mounter that produces a board on which a component is mounted by picking up the component supplied by a component supply device and mounting the component on the board, and it is a gist to include a head having a suction nozzle that picks up the component; a head moving device configured to move the head; an imaging device configured to image a component supply position of the component supply device; and a control device configured to, when a pickup error occurs after a pickup operation that picks up the component is performed by the suction nozzle, image the component supply position with the imaging device, in a case where a number of the boards produced from a start of production is within a predetermined number of the boards, and control the head and the moving device so that a pickup position is set based on an obtained captured image and the component is picked up at the set pickup position, and control the head and the moving device so that the component supplied by the component supply device is picked up at a predetermined pickup position or a pickup position corrected according to the amount of pickup deviation when the pickup operation is previously performed, in a case where the number of the boards produced from the start of production exceeds a predetermined number of the boards.

When the pickup error occurs after the pickup operation that picks up the component is performed by the suction nozzle, the second component mounter of the present disclosure images the component supply position in a case where the number of the boards produced from the start of production is within a predetermined number of the boards, and performs a retry operation that sets the pickup position based on the obtained captured image and causes the component to be picked up by the suction nozzle at the set pickup position. In addition, the second component mounter performs a retry operation to cause the component to be picked up by the suction nozzle at a predetermined pickup position or at a pickup position corrected according to the amount of pickup deviation when the pickup operation is previously performed, in a case where the number of the boards produced from the start of production exceeds a predetermined number of the boards. Therefore, in a case where the number of the boards produced from the start of production is within a predetermined number of the boards, by imaging the component supply position, setting the pickup position, and performing the retry operation, it is possible to improve the pickup accuracy of the component, and to prevent from repeating the wasteful disposal of the component. On the other hand, in a situation where the number of the boards produced from the start of production exceeds a predetermined number of the boards and the production is stable, it is possible to suppress degradation in the production efficiency by performing the retry operation as it is without imaging the component supply position. Here, the predetermined number of the boards may be one.

DESCRIPTION OF EMBODIMENTS

Next, embodiments for performing the present disclosure will be described using examples.

Figure 1:
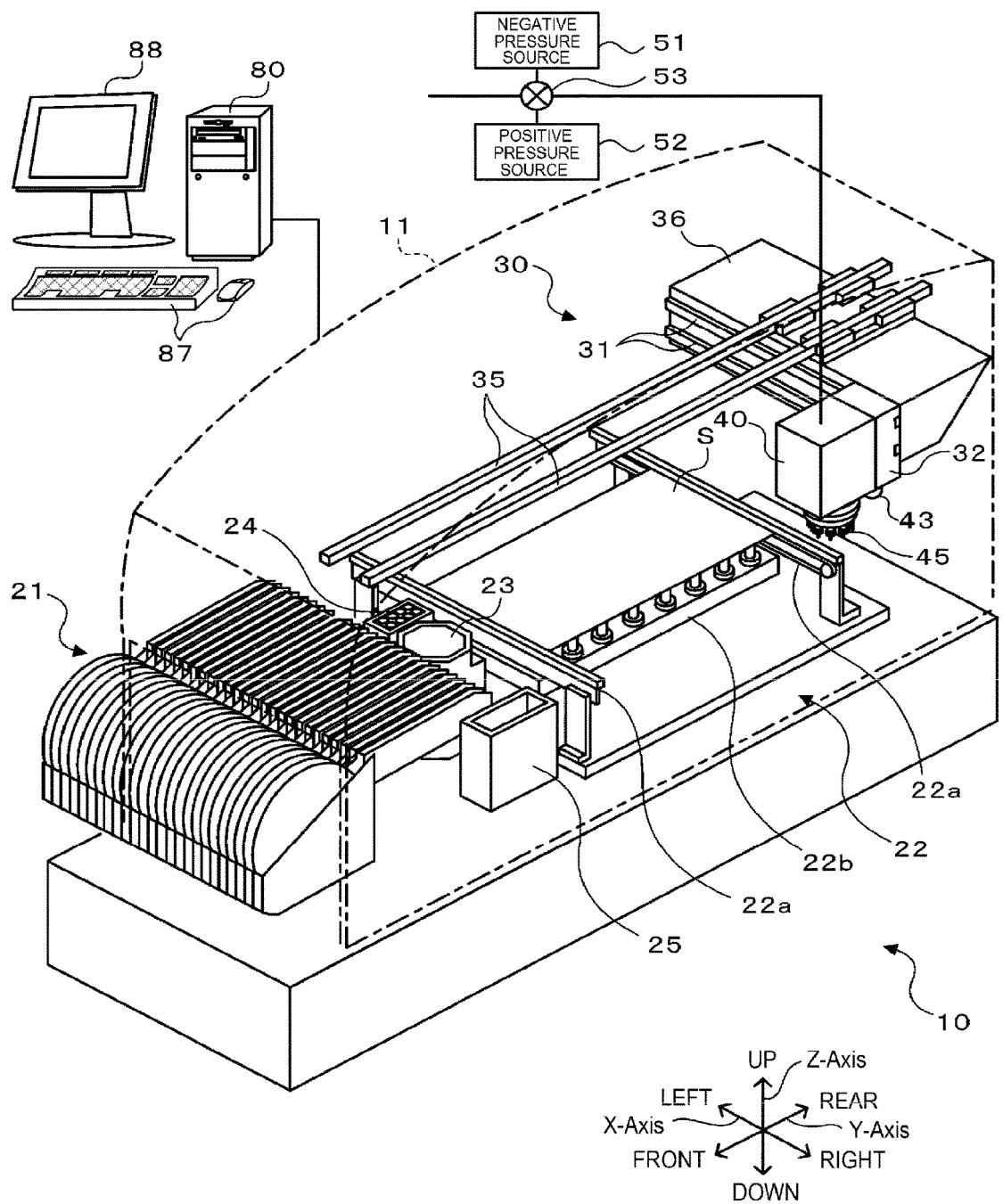
FIG. 1 is a configuration view illustrating an outline of a configuration of component mounter 10 of the present embodiment.
Figure 2:
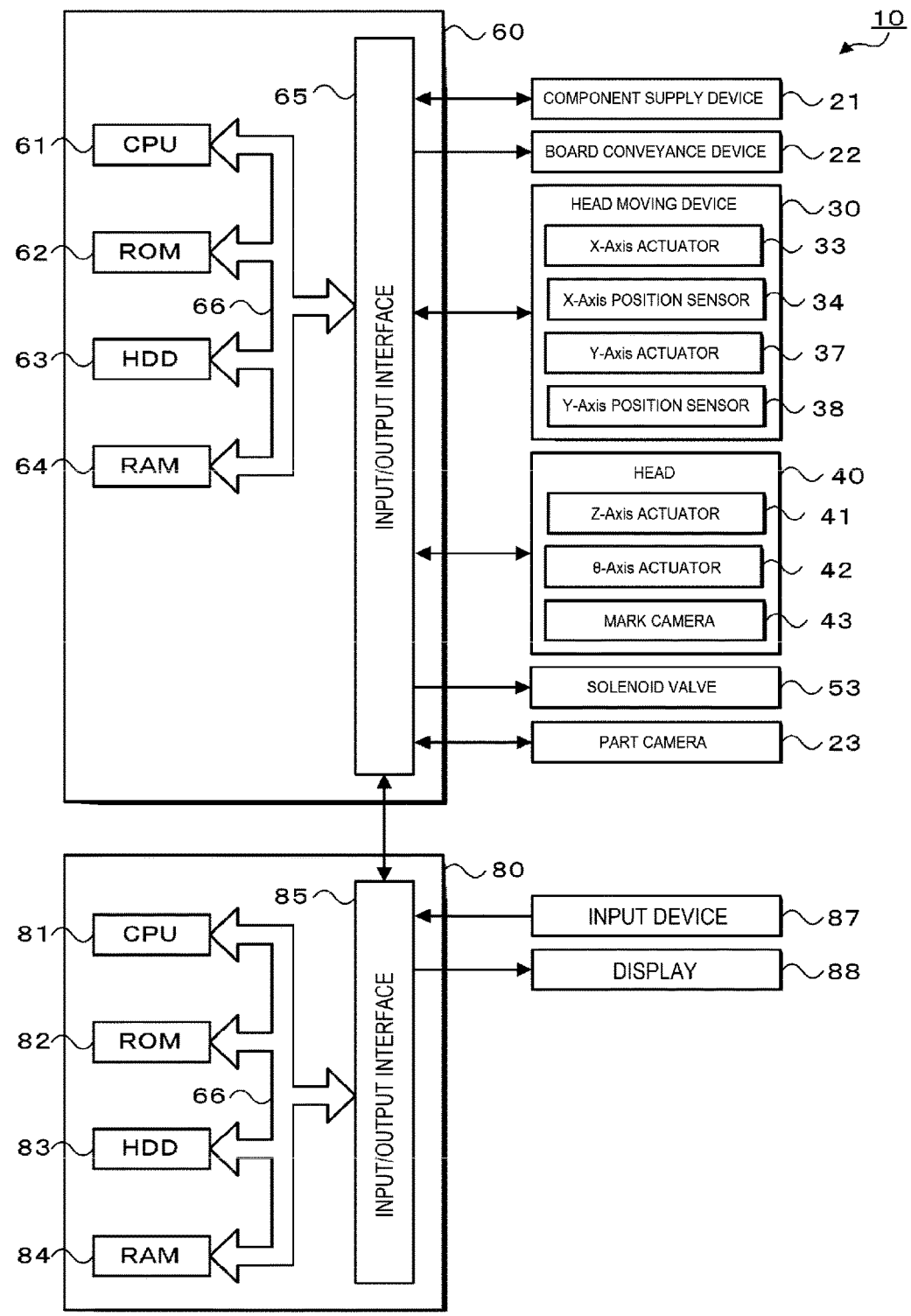
FIG. 2 is an explanatory diagram illustrating an electrical connection relationship between control device 60 and management device 80 of component mounter 20.

FIG. 1 is a configuration view illustrating an outline of a configuration of component mounter 10 of the present embodiment. FIG. 2 is an explanatory diagram illustrating an electrical connection relationship between control device 60 and management device 80 of component mounter 20. In FIG. 1, the left-right direction denotes the X-axis direction, the front-rear (depth) direction denotes the Y-axis direction, and the up-down direction denotes the Z-axis direction.

As illustrated in FIG. 1, component mounter 10 is provided with component supply device 21 for supplying the component, board conveyance device 22 for conveying board S, head 40 having suction nozzle 45 for picking up the component, head moving device 30 for moving head 40 in the X-axis direction and the Y-axis direction, and control device 60 (refer to FIG. 2) for controlling the entire mounter. In addition, in addition to these devices, component mounter 10 is provided with part camera 23 for capturing a pickup posture of a component picked up by suction nozzle 45, nozzle station 24 for accommodating suction nozzle 45 for exchange, discard box 25 for discarding a component which is a target of the error when an error occurs in the picked-up component, mark camera 43 provided in head 40 for capturing a positioning reference mark attached to board S, and the like. Multiple component mounters 10 are arranged side by side in the board conveyance direction (X-axis direction) to form a production line. The production line is managed by management device 80.

Component supply device 21 is configured as a tape feeder including, for example, a tape reel on which a carrier tape accommodating the components at predetermined intervals is wound, and a tape feeding mechanism for drawing the carrier tape from the tape reel by driving of a driving motor to feed the carrier tape to a component supply position. Component supply device 21 (tape feeder) is detachably attached to a feeder base (not illustrated) provided in component mounter 10.

Board conveyance device 22 is provided with a pair of conveyor rails 22a disposed at intervals in the Y-axis direction, and conveys board S from the left to the right in FIG. 1 (board conveyance direction) by driving the pair of conveyor rails 22a. Backup plate 22b for backing up carried-in board S from the bottom surface side is provided between the pair of conveyor rails 22a.

As illustrated in FIG. 1, head moving device 30 is provided with a pair of X-axis guide rails 31, X-axis slider 32, X-axis actuator 33 (refer to FIG. 2), a pair of Y-axis guide rails 35, Y-axis slider 36, and Y-axis actuator 37 (refer to FIG. 2). The pair of Y-axis guide rails 35 are disposed on an upper stage of housing 11 so as to extend parallel to each other in the Y-axis direction. Y-axis slider 36 is spanned by the pair of Y-axis guide rails 35, and moves in the Y-axis direction along Y-axis guide rail 35 by the driving of Y-axis actuator 37. The pair of X-axis guide rails 31 are disposed on a front surface of Y-axis slider 36 so as to extend parallel to each other in the X-axis direction. X-axis slider 32 is spanned by the pair of X-axis guide rails 31, and moves in the X-axis direction along X-axis guide rail 31 by the driving of X-axis actuator 33. Head 40 is attached to X-axis slider 32, and head moving device 30 moves head 40 in the X-axis direction and the Y-axis direction by moving X-axis slider 32 and Y-axis slider 36.

Head 40 is provided with Z-axis actuator 41 (refer to FIG. 2) that moves suction nozzle 45 in the Z-axis (up-down) direction, and θ-axis actuator 42 (refer to FIG. 2) that rotates suction nozzle 45 around the Z-axis. As illustrated in FIG. 1, the suction port of suction nozzle 45 selectively communicates with negative pressure source 51, positive pressure source 52, and the air introduction port via solenoid valve 53. Head 40 can pick up the component by acting negative pressure on the suction port by driving solenoid valve 53 so that the suction port of suction nozzle 45 communicates with negative pressure source 51. In addition, by driving solenoid valve 53 so that the suction port of suction nozzle 45 communicates with positive pressure source 52, head 40 can act positive pressure on the suction port to release the pickup of the component.

When the component picked up by suction nozzle 45 passes above part camera 23, part camera 23 images the component and outputs the obtained captured image to control device 60. Control device 60 determines the amount of positional deviation (amount of pickup deviation) of the picked-up component or determines the presence or absence of a pickup error by performing image processing of recognizing the component in the captured image. Here, the pickup error includes a pickup mistake in which a component is not picked up by suction nozzle 45, a standing pickup error in which a component is picked up by suction nozzle 45 with the component standing, a pickup deviation error in which a pickup deviation exceeding an allowable range occurs in a component picked up by suction nozzle 45, a component difference error in which a component picked up by suction nozzle 45 is not a correct component, and the like.

As illustrated in FIG. 2, control device 60 is configured as a microprocessor centered on CPU 61, and is provided with ROM 62, HDD 63, RAM 64, and input and output interface 65, in addition to CPU 61. These are electrically connected to one another via bus 66. A position signal from X-axis position sensor 34 for sensing the position of X-axis slider 32, a position signal from Y-axis position sensor 38 for sensing the position of Y-axis slider 36, an image signal from mark camera 43, an image signal from part camera 23, and the like are input to control device 60 via input and output interface 65. On the other hand, a control signal to component supply device 21, a control signal to board conveyance device 22, a drive signal to X-axis actuator 33, a drive signal to Y-axis actuator 37, a drive signal to Z-axis actuator 41, a drive signal to θ-axis actuator 42, a drive signal to solenoid valve 53, and the like are output from control device 60 via input and output interface 65. In addition, control device 60 is connected to management device 80 so as to be capable of bidirectional communication, and exchanges data and control signals with each other.

For example, management device 80 is a general-purpose computer, and is provided with CPU 81, ROM 82, HDD 83, RAM 84, input and output interface 85, and the like, as illustrated in FIG. 2. These are electrically connected to one another via bus 86. An input signal from input device 87 such as a mouse and a keyboard is input to management device 80 via input and output interface 85. In addition, an image signal to display 88 is output from management device 80 via input and output interface 85. HDD 83 stores a production job of board S. Here, the production job of board S includes a production schedule such as which components are mounted on board S in which order in each component mounter 10, and how many the boards of board S on which the components are mounted in this manner are prepared. In addition, the production job also includes board data related to the board to be produced, head data related to head 40 to be used, nozzle data related to suction nozzle 45 to be used, component data related to the component to be mounted, supply position data related to the component supply position of component supply device 21, mounting position data related to a target mounting position of the component, other production setting data, and the like. The production setting data includes component recognition data used for the above-described image processing, error correspondence setting data (component rescue function described later or automatic switching function for automatically switching on/off of the component rescue function) that defines the correspondence in a case where an error occurs in the image processing, and the like. Management device 80 generates a production job based on various types of data input by an operator via input device 87, transmits the generated production job to each component mounter 10, and thus instructs each component mounter 10 to start production.

Figure 3:
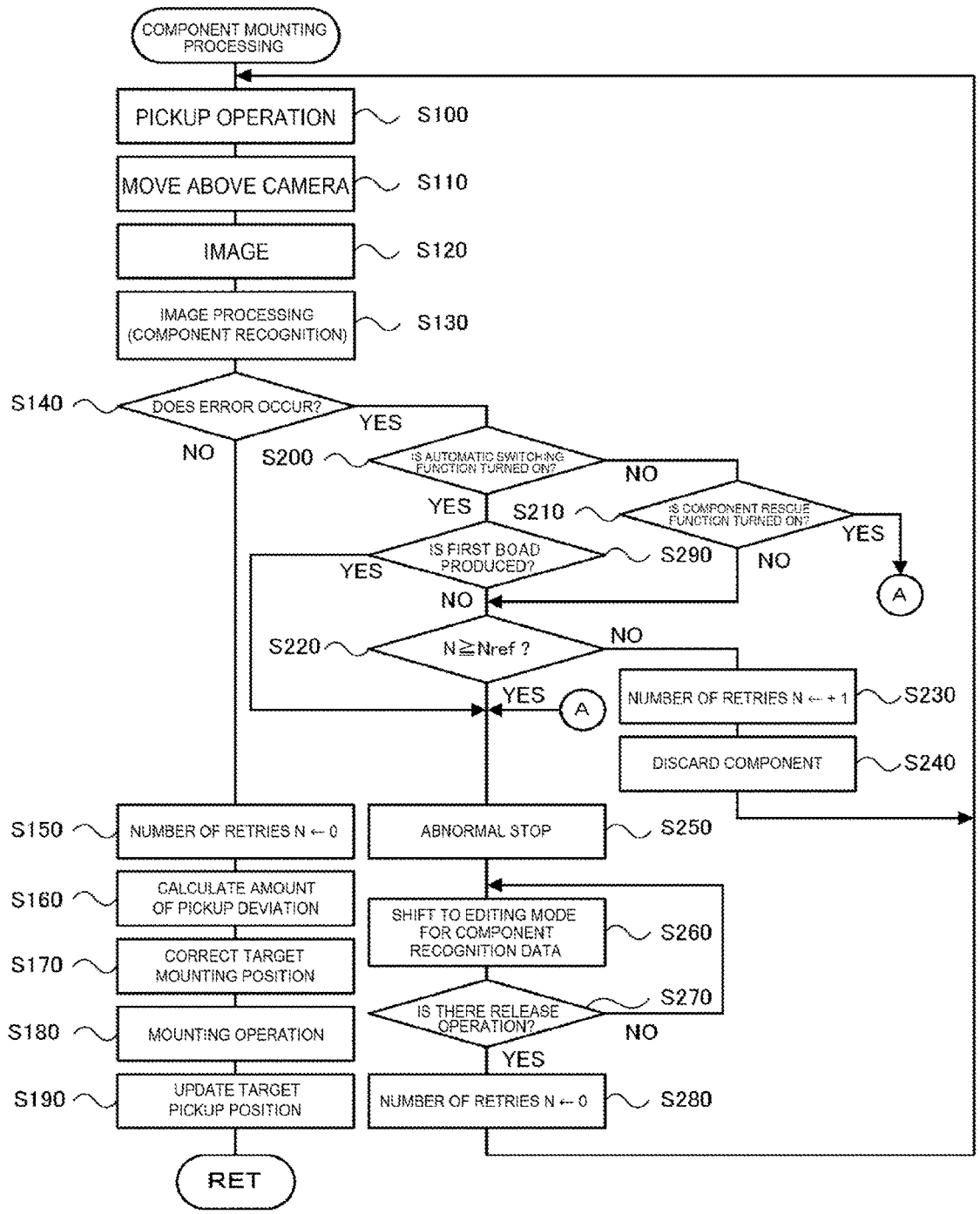
FIG. 3 is a flowchart illustrating an example of component mounting processing.

Next, an operation of component mounter 10 of the present embodiment configured as described above will be described. FIG. 3 is a flowchart illustrating an example of component mounting processing executed by CPU 61 of control device 60. This processing is executed when the start of production is instructed by the operator. Control device 60 receives the production job transmitted from management device 80, and executes the component mounting processing based on the received production job.

When the component mounting processing is executed, CPU 61 of control device 60 first performs a pickup operation for picking up the component supplied from component supply device 21 to suction nozzle 45 at a target pickup position (S100). Here, specifically, the pickup operation is performed by driving and controlling head moving device 30 so that suction nozzle 45 attached to head 40 is directly above the target pickup position, then driving and controlling Z-axis actuator 41 so that suction nozzle 45 descends until a tip end (suction port) of suction nozzle 45 abuts on the component, and driving and controlling solenoid valve 53 so that negative pressure acts on the suction port of suction nozzle 45. As the target pickup position, the component supply position of component supply device 21 specified from the supply position data is determined as an initial position. Subsequently, CPU 61 drives and controls head moving device 30 so that the component picked up by suction nozzle 45 moves above part camera 23 (S110), and images the component with part camera 23 (S120).

CPU 61 performs image processing of recognizing the component in the obtained captured image (S130), and determines the presence or absence of an error (S140). Here, the image processing is performed using the component recognition data. The component recognition data includes data on characteristic portions of the component, such as the shape and size of the component main body, the position of the terminal, and the like. When it is determined that no error occurs, CPU 61 initializes the number of retries N to the value 0 (S150). CPU 61 calculates the amount of positional deviation (amount of pickup deviation) of the component picked up by suction nozzle 45 based on the result of the image processing (S160), corrects the target mounting position based on the amount of pickup deviation (S170), and performs the mounting operation for mounting the picked-up component on the target mounting position (S180). Here, specifically, the mounting operation is performed by driving and controlling head moving device 30 so that the component picked up by suction nozzle 45 is directly above the target mounting position of board S, then driving and controlling Z-axis actuator 41 so that suction nozzle 45 descends until the component abuts on the surface of board S, and driving and controlling solenoid valve 53 so that positive pressure acts on the suction port of suction nozzle 45. When performing the mounting operation in this manner, CPU 61 updates the target pickup position to be used when picking up the same type of component next based on the amount of pickup deviation calculated in Step S160 (S190), and terminates the present processing.

On the other hand, when it is determined that an error occurs in Step S140, CPU 61 determines whether the setting of an automatic switching function is turned on (S200), and whether the setting of the component rescue function is turned on (S210), respectively. When it is determined that the setting of the automatic switching function is not turned on but turned off and the setting of a component rescue function is not turned on but turned off, CPU 61 determines whether the number of retries N is a specified number of times Nth or more (S220). Here, the specified number of times Nth is an allowable number of repetitions of the retry processing. When it is determined that the number of retries N is less than the specified number of times Nth, CPU 61 increments the number of retries N by the value 1 (S230), performs a discarding operation to discard the component which is a target of the error (S240), returns to S100, and performs retry processing to pick up a new component by suction nozzle 45. Here, specifically, the discarding operation is performed by driving and controlling head moving device 30 so that the component which is a target of the error is directly above discard box 25, and then driving and controlling solenoid valve 53 so that the positive pressure acts on the suction port of suction nozzle 45. As a result, the component which is a target of the error separates from the suction port of suction nozzle 45 and falls into discard box 25. As described above, by repeating the retry processing within the range of the specified number of times Nth, it is possible to prevent a decrease in the production efficiency.

On the other hand, when it is determined that the number of retries N is the specified number of times Nth or more in S220, CPU 61 performs an abnormal stop (production stop) while the component which is a target of the error is picked up by suction nozzle 45 (S250). As a result, the operator can check component mounter 10 which is a target of the error to confirm the cause of the abnormality. When stopping abnormally, CPU 61 proceeds to an editing mode for editing component recognition data (S260). Here, in the present embodiment, the editing mode is generated in management device 80 received the stop signal by component mounter 10 transmitting the stop signal to management device 80. The editing of the component recognition data in the editing mode is performed by the operator changing the dimension or the coordinate in a case of setting the component recognition data by the dimension in each direction of the component or the positional coordinate of the terminal, or is performed by replacing the captured image in a case of setting the component recognition data based on the captured image in which the component is imaged in advance. Next, in Step S270, CPU 61 waits for the operator to perform a release operation of the abnormal stop. Here, for example, the release operation can be performed by resetting the feeder power supply by the operator detaching component supply device 21 (tape feeder) from the feeder base and reattaching component supply device 21. When it is determined that the release operation is performed, CPU 61 initializes the number of retries N to the value 0 (S280), and returns to the processing of S100 (pickup operation). As a result, component mounter 10 releases the abnormal stop state and restarts the production.

When it is determined in Step S210 that the setting of the component rescue function is turned on, CPU 61 performs the abnormal stop (production stop) while picking up the component which is a target of the error by suction nozzle 45 regardless of the number of retries N (S250), proceeds to the editing mode (S260), and restarts the production when the operator performs the release operation of the abnormal stop (S270). As a result, since component mounter 10 does not discard the component as long as the setting of the component rescue function is turned on, it is possible to suppress the wasteful consumption of the component, for example, in a case where an expensive component is used.

When it is determined in Step S200 that the setting of the automatic switching function is turned on, CPU 61 determines whether the number of the boards produced after the production is started is within a predetermined number of the boards (for example, first sheet) (S290). Here, the number of the boards produced after the production is started corresponds to the number of the boards produced after the model change of the production board is performed. In addition, in a case where the power supply of component mounter 20 is once turned off and turned on again, the number of the boards produced after the power supply is turned on may be the number of the boards produced after the production is started.

When it is determined that the number of the boards produced is within a predetermined number of the boards (first board), CPU 61 performs the abnormal stop (production stop) while picking up the component which is a target of the error by suction nozzle 45 (S250), proceeds to the editing mode (S260), and restarts the production when the operator performs the release operation of the abnormal stop (S270).

When it is determined that the number of the boards produced exceeds a predetermined number of the boards (second and subsequent boards), CPU 61 determines whether the number of retries N is a specified number of times Nth or more (S220). When it is determined that the number of retries N is not the specified number of times Nth or more but less than the specified number of times Nth, CPU 61 increments the number of retries N by the value 1 (S230), discards the component which is a target of the error (S240), and then performs retry processing. On the other hand, when it is determined that the number of retries N is the specified number of times Nth or more, CPU 61 performs the abnormal stop (production stop) while picking up the component which is a target of the error by suction nozzle 45 (S250), proceeds to the editing mode (S260), and restarts the production when the operator performs the release operation of the abnormal stop (S270).

That is, when an error occurs, in a case where the setting of the automatic switching function is turned on, if the number of the boards produced from the start of production is less than a predetermined number of the boards, CPU 61 abnormally stops and proceeds to the editing mode while holding the picked-up component, similarly to the on-setting of the component rescue function, whereas if the number of the boards produced from the start of production exceeds a predetermined number of the boards, CPU 61 performs the retry processing of discarding the picked-up component and picking up a new component until the number of retries reaches a specified number of times Nth or more, similarly to the off-setting of the component rescue function. Therefore, in a situation where the number of the boards produced from the start of production is within a predetermined number of the boards and the production is difficult to stabilize, by stopping the production in a state where the component which is a target of the error is held by the suction nozzle, it is possible to confirm the cause of the error and prevent the component from being wastefully discarded. In addition, in a situation where the number of the boards produced from the start of production exceeds a predetermined number of the boards and the production is stable, by performing the retry processing involving the disposal of components, it is possible to suppress degradation in the production efficiency due to the stop of the production.

Here, the correspondence between the main elements of the embodiments and the main elements of the present disclosure described herein will be described. That is, suction nozzle 45 corresponds to a pickup member, and control device 60 corresponds to a control device. In addition, part camera 23 corresponds to an imaging device.

It goes without saying that the present disclosure is not limited to the above-described embodiments, and can be implemented in various aspects as long as it belongs to the technical scope of the disclosure of the present disclosure.

For example, in the above embodiment, component mounter 10 has a component rescue function of stopping the production while picking up component P by suction nozzle 45 regardless of the number of the boards produced from the start of production, in a case where an error occurs after the pickup operation is performed. However, component mounter 10 may perform retry processing of discarding the picked-up component and picking up a new component until the number of retries reaches the specified number of times Nth or more, in a case where an error occurs after the pickup operation is performed without having such a component rescue function.

In addition, in the above embodiment, in a case where an error (image processing error) occurred, when the number of the boards produced from the start of production was within a predetermined number of the boards, CPU 61 stopped the production while causing suction nozzle 45 to pick up the component, and proceeded to the editing mode for editing the component recognition data. However, CPU 61 may stop the production while causing suction nozzle 45 to pick up the component, but may not proceed to the editing mode.

In addition, in the above embodiment, in a case where the retry processing is executed due to the occurrence of an error (image processing error), when the number of retries N is the specified number of times Nth or more in S220, it is assumed that CPU 61 abnormally stops (production stop) while holding the component which is a target of the error. However, CPU 61 may abnormally stop after discarding the component which is a target of the error when the number of retries N is the specified number of times Nth or more.

Figure 4:
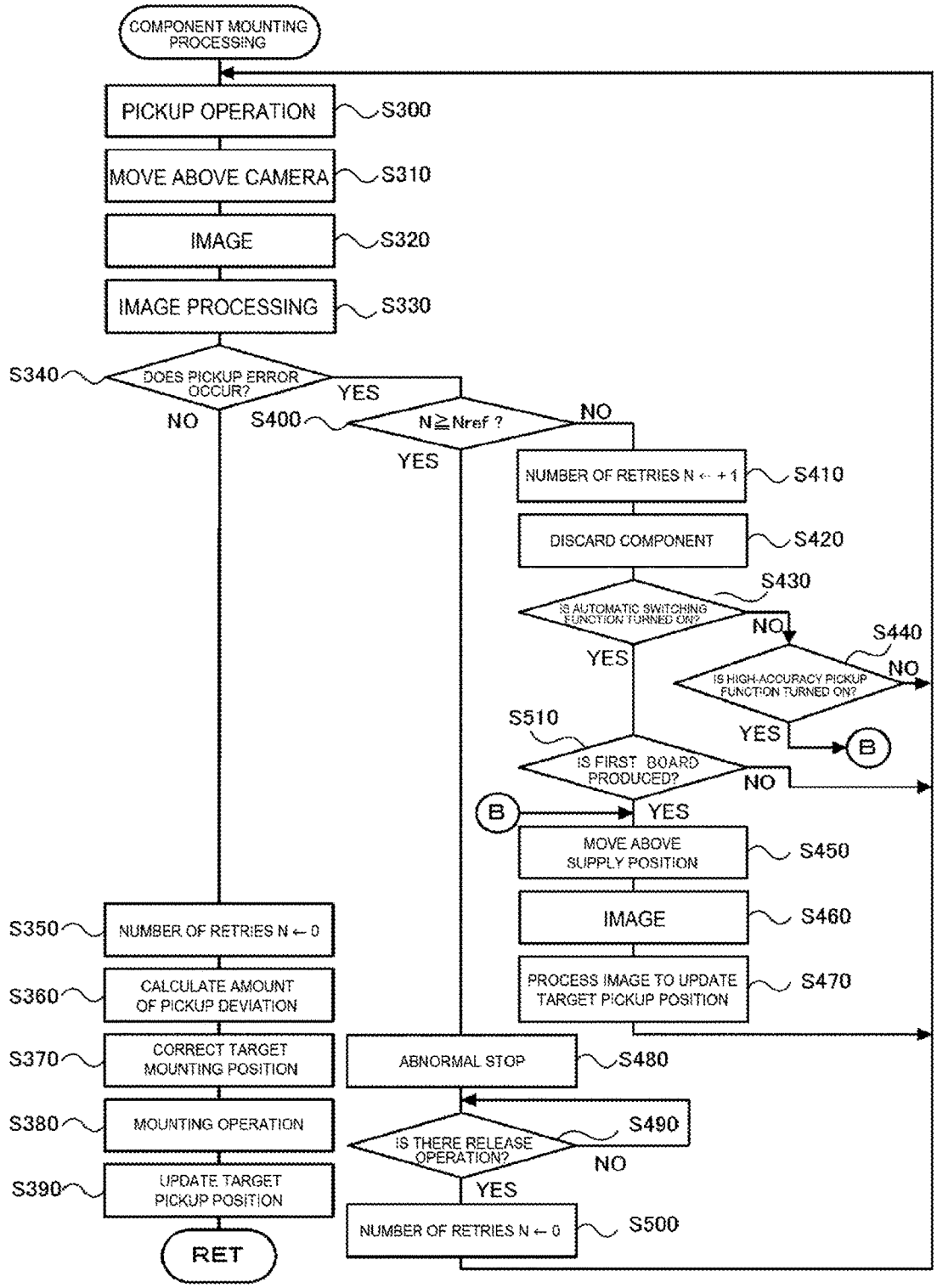
FIG. 4 is a flowchart illustrating component mounting processing of a modification example.

In addition, in the above embodiment, in a case where an error occurs, when the number of the boards produced from the start of production is within a predetermined number of the boards, CPU 61 executes the same processing as the on-setting of the component rescue function, and when the number of the boards produced from the start of production exceeds a predetermined number of the boards, executes the same processing as the off-setting of the component rescue function. However, CPU 61 may perform the following processing in a case where an error occurs. FIG. 4 is a flowchart illustrating component mounting processing of a modification example executed by CPU 61 of control device 60.

In component mounting processing of the modification example, CPU 61 of control device 60 first performs the pickup operation for picking up the component by suction nozzle 45 at the target pickup position (S300), moves the picked-up component above part camera 23 (S310), and images the component with part camera 23 (S320), similarly to S100 to S120. CPU 61 performs image processing of recognizing the component in the obtained captured image (S330), and determines whether a pickup error has occurred (S340).

When it is determined that no pickup error has occurred, CPU 61 initializes the number of retries N to the value 0 (S350), calculates the amount of pickup deviation of the component (S360), corrects the target mounting position based on the amount of pickup deviation (S370), performs the mounting operation (S380), updates the target pickup position of the same type of component to be picked up next (S390), and terminates the present processing, similarly to S150 to S190.

On the other hand, when it is determined that a pickup error has occurred, CPU 61 determines whether the number of retries N is a specified number of times Nth or more (S400). When it is determined that the number of retries N is not the specified number of times Nth or more, but less than the specified number of times Nth, CPU 61 increments the number of retries N by the value 1 (S410), and performs a discarding operation to discard the component which is a target of the error (S420). CPU 61 determines whether the setting of the automatic switching function is turned on (S430) and whether the setting of the high-accuracy pickup function is turned on (S440), respectively. The setting of the automatic switching function of the modification example is a setting for automatically switching on/off of the high-accuracy pickup function. The high-accuracy pickup function will be described later.

When it is determined that the setting of the automatic switching function is not turned on but turned off and the setting of the high-accuracy pickup function is not turned on but turned off, CPU 61 returns to S300 to perform retry processing of repeating the pickup operation. When it is determined in Step S400 that the number of retries N is the specified number of times Nth or more in the process of repeating the retry processing, CPU 61 performs an abnormal stop (production stop) while picking up the component which is a target of the error by suction nozzle 45 (S480). When stopping abnormally, CPU 61 waits for the operator to perform a release operation of the abnormal stop (S490), initializes the number of retries N to the value 0 (S500), and returns to the processing of S300 (pickup operation).

When it is determined in Step S440 that the setting of the high-accuracy pickup function is turned on, CPU 61 drives and controls head moving device 30 so that mark camera 43 moves above the component supply position of component supply device 21 (S450). Subsequently, CPU 61 images the component supply position with mark camera 43 (S460), processes the obtained captured image to update the target pickup position (S470), returns to S300, and performs retry processing of repeating the pickup operation at the updated target pickup position. As a result, even when a slight positional deviation occurs in the position of the component supplied to the component pickup position, the component can be picked up by the suction nozzle in an appropriate posture, and it is possible to prevent the subsequent pickup error from occurring.

When it is determined in Step S430 that the setting of the automatic switching function is turned on, CPU 61 determines whether the number of the boards produced from the start of production is within a predetermined number of the boards (for example, first sheet) (S510). When it is determined that the number of the boards produced is within a predetermined number of the boards (for example, first sheet), CPU 61 images the component supply position (S460), processes the obtained captured image to update the target pickup position (S470), and returns to S300 to perform the retry processing. On the other hand, when it is determined that the number of the boards produced exceeds a predetermined number of the boards (second and subsequent the boards), CPU 61 returns to Step S300 and performs the retry processing without updating the target pickup position. That is, in a case where the setting of the automatic switching function is turned on, when the number of the boards produced from the start of production is within a predetermined number of the boards, CPU 61 images the component supply position, updates the target pickup position, and performs the retry processing (re-pickup), similarly to the on-setting of the high-accuracy pickup function, whereas when the number of the boards produced from the start of production exceeds a predetermined number of the boards, CPU 61 performs the retry processing without updating the target pickup position, similarly to the offsetting of the high-accuracy pickup function. Therefore, in a situation where the number of the boards produced from the start of production is within a predetermined number of the boards and the production is difficult to stabilize, by capturing the component supply position, setting the pickup position, and performing the retry processing, it is possible to improve the pickup accuracy of the component, and to suppress the repetition of the wasteful disposal of the component. On the other hand, in a situation where the number of the boards produced from the start of production exceeds a predetermined number of the boards and the production is stable, by performing the retry processing as it is without capturing the component supply position, it is possible to suppress degradation in the production efficiency.

As described above, a first component mounter of the present disclosure is a component mounter that produces a board on which a component is mounted by picking up the component and mounting the component on the board, and it is a gist to include a pickup member configured to pick up the component; and a control device configured to, when a predetermined error occurs after a pickup operation that picks up the component is performed by the pickup member, execute first error handling processing that stops production in a state where the component, which is a target of an error, is held by the pickup member, in a case where the number of the boards produced from a start of production is within a predetermined number of the boards, perform a retry operation that discards the component picked up by the pickup member and picks up a new component, in a case where the number of the boards produced from the start of production exceeds the predetermined number of the boards, and execute second error handling processing that stops production when the error is not resolved even if the retry operation is performed.

When the predetermined error occurs after the pickup operation that picks up the component is performed by the pickup member, the first component mounter of the present disclosure executes the first error handling processing that stops the production in a state where the component, which is a target of an error, is held by the pickup member, in a case where the number of the boards produced from the start of production is within a predetermined number of the boards. In addition, the component mounter performs the retry operation that discards the component picked up by the pickup member and picks up the new component, in a case where the number of the boards produced from the start of production exceeds a predetermined number of the boards, and executes the second error handling processing that stops the production when the error is not resolved even if the retry operation is performed. In a component mounter, production may not be stable immediately after a model change or the like is performed. Therefore, in a case where the number of the boards produced from the start of production is within a predetermined number of the boards, by stopping the production in a state where the component, which is a target of the error, is held by the pickup member, it is possible to confirm a cause of the error and to prevent the component from being wastefully discarded. On the other hand, in a situation where the number of the boards produced from the start of production exceeds a predetermined number of the boards and the production is stable, by performing the retry operation involving the disposal of components, it is possible to suppress degradation in the production efficiency due to the stop of the production. Here, the predetermined number of the boards may be one.

In such a first component mounter of the present disclosure, the component mounter may include an imaging device configured to image the component picked up by the pickup member, in which the control device may be configured to image the picked-up component after the pickup operation is performed, execute image processing that recognizes the component in an obtained captured image, when an image processing error occurs in the image processing, execute the first error handling processing, in a case where the number of the boards produced from the start of production is within the predetermined number of the boards, and execute the second error handling processing, in a case where the number of the boards produced from the start of production exceeds the predetermined number of the boards, and the first error handling processing may stop production and may proceed to an editing mode for editing component recognition data used in the image processing. By enabling the component recognition data to be edited in the editing mode, it is possible to suppress a reoccurrence of an image processing error.

In addition, in the first component mounter of the present disclosure, the control device may be configured to receive a production setting, and when the error occurs in the state where a first setting is set as the production setting, execute the first error handling processing, in a case where the number of the boards produced from the start of production is within a predetermined number of the boards, execute the second error handling processing, in a case where the number of the boards produced from the start of production exceeds the predetermined number of the boards, and when the error occurs in a state where a second setting different from the first setting is set as the production setting, execute the second error handling processing regardless of the number of the boards produced from the start of production. As a result, the user can select whether to give priority to the rescue of the component or the production efficiency. For example, in a case of producing using an expensive component, the user can select to give priority to the rescue of the component, whereas in a case of producing using an inexpensive component, the user can select to give priority to the production efficiency.

A second component mounter of the present disclosure is a component mounter that produces a board on which a component is mounted by picking up the component supplied by a component supply device and mounting the component on the board, and it is a gist to include a head having a suction nozzle that picks up the component; a head moving device configured to move the head; an imaging device configured to image a component supply position of the component supply device; and a control device configured to, when a pickup error occurs after a pickup operation that picks up the component is performed by the suction nozzle, image the component supply position with the imaging device, in a case where the number of the boards produced from a start of production is within a predetermined number of the boards, and control the head and the moving device so that a pickup position is set based on an obtained captured image and the component is picked up at the set pickup position, and control the head and the moving device so that the component supplied by the component supply device is picked up at a predetermined pickup position or a pickup position corrected according to the amount of pickup deviation when the pickup operation is previously performed, in a case where the number of the boards produced from the start of production exceeds a predetermined number of the boards.

When the pickup error occurs after the pickup operation that picks up the component is performed by the suction nozzle, the second component mounter of the present disclosure images the component supply position in a case where the number of the boards produced from the start of production is within a predetermined number of the boards, and performs a retry operation that sets the pickup position based on the obtained captured image and causes the component to be picked up by the suction nozzle at the set pickup position. In addition, the second component mounter performs a retry operation to cause the component to be picked up by the suction nozzle at a predetermined pickup position or at a pickup position corrected according to the amount of pickup deviation when the pickup operation is previously performed, in a case where the number of the boards produced from the start of production exceeds a predetermined number of the boards. Therefore, in a case where the number of the boards produced from the start of production is within a predetermined number of the boards, by imaging the component supply position, setting the pickup position, and performing the retry operation, it is possible to improve the pickup accuracy of the component, and to prevent from repeating the wasteful disposal of the component. On the other hand, in a situation where the number of the boards produced from the start of production exceeds a predetermined number of the boards and the production is stable, it is possible to suppress degradation in the production efficiency by performing the retry operation as it is without imaging the component supply position. Here, the predetermined number of the boards may be one.

It goes without saying that the present disclosure is not limited to the above-described embodiments, and can be implemented in various aspects as long as it belongs to the technical scope of the present disclosure.

INDUSTRIAL APPLICABILITY

The present disclosure can be applied in a manufacturing industry for the component mounter or the like.

REFERENCE SIGNS LIST 10 component mounter, 11 housing, 21 component supply device, 22 board conveyance device, 22a conveyor rail, 22b backup plate, 23 part camera, 24 nozzle station, 25 discard box, 30 head moving device, 31 X-axis guide rail, 32 X-axis slider, 33 X-axis actuator, 35 Y-axis guide rail, 36 Y-axis slider, 37 Y-axis actuator, 40 head, 41 Z-axis actuator, 42 θ-axis actuator, 43 mark camera, 51 negative pressure source, 52 positive pressure source, 53 solenoid valve, 60 control device, 61 CPU, 62 ROM, 63 HDD, 64 RAM, 65 input and output interface, 66 bus, 80 management device, 81 CPU, 82 ROM, 83 HDD, 84 RAM, 85 input and output interface, 86 bus, 87 input device, 88 display, S board.

The invention claimed is:

1. A component mounter that produces a board on which a component is mounted by picking up the component and mounting the component on the board, the component mounter comprising:
a pickup member configured to pick up the component; and
a control device configured to, when a predetermined error occurs after a pickup operation that picks up the component is performed by the pickup member, execute a first error handling processing that stops a production in a state where the component, which is a target of an error, is held by the pickup member, in a case where a number of the boards produced from a start of production is within a predetermined number of the boards, perform a retry operation that discards the component picked up by the pickup member and picks up a new component, in a case where the number of the boards produced from the start of the production exceeds the predetermined number of the boards, and execute a second error handling processing that stops the production when the error is not resolved even if the retry operation is performed,
wherein the control device proceeds to an editing mode for editing a component recognition data used in an image processing that recognizes the component in an obtained captured image when the production is stopped.

2. The component mounter according to claim 1, wherein the predetermined number of the boards is one.

3. The component mounter according to claim 1, further comprising:
an imaging device configured to image the component picked up by the pickup member, wherein
the control device is configured to image the picked-up component after the pickup operation is performed, execute the image processing, when an image processing error occurs in the image processing, execute the first error handling processing, in a case where the number of the boards produced from the start of production is within the predetermined number of the boards, and execute the second error handling processing, in a case where the number of the boards produced from the start of production exceeds the predetermined number of the boards.

4. The component mounter according to claim 1, wherein the first error handling stops the production when a number of the retry operations exceeds a predetermined number of retries.

5. A component mounter that produces a board on which a component is mounted by picking up the component and mounting the component on the board, the component mounter comprising:
a pickup member configured to pick up the component; and
a control device configured to, when a predetermined error occurs after a pickup operation that picks up the component is performed by the pickup member, execute a first error handling processing that stops production in a state where the component, which is a target of an error, is held by the pickup member, in a case where a number of the boards produced from a start of production is within a predetermined number of the boards, perform a retry operation that discards the component picked up by the pickup member and picks up a new component, in a case where the number of the boards produced from the start of production exceeds the predetermined number of the boards, and execute a second error handling processing that stops production when the error is not resolved even if the retry operation is performed,
wherein the control device is configured to receive a production setting, and when the error occurs in the state where a first setting is set as the production setting, execute the first error handling processing, in a case where the number of the boards produced from the start of production is within the predetermined number of the boards, and execute the second error handling processing, in a case where the number of the boards produced from the start of production exceeds the predetermined number of the boards, and when the error occurs in a state where a second setting different from the first setting is set as the production setting, execute the second error handling processing regardless of the number of the boards produced from the start of production.

* * * * *